United States Patent
Birth et al.

[11] Patent Number: 5,832,374
[45] Date of Patent: Nov. 3, 1998

[54] RADIO TRANSCEIVER INCLUDING TRANSMITTER POWER CONTROL CIRCUIT

[75] Inventors: Winfrid Birth, Veitsbronn; Erich Saur, Nürnberg; Christopher Marshall, Stein, all of Germany

[73] Assignee: U.S. Phillips Corporation, New York, N.Y.

[21] Appl. No.: 742,330

[22] Filed: Nov. 1, 1996

Related U.S. Application Data

[63] Continuation of Ser. No. 340,567, Nov. 16, 1994, abandoned.

[30] Foreign Application Priority Data

Nov. 19, 1993 [DE] Germany ............... 43 39 526.0

[51] Int. Cl.$^6$ ............................................. H01Q 11/12
[52] U.S. Cl. ............................... 455/127; 455/115
[58] Field of Search ........................... 455/89, 115, 126, 455/127, 575; 330/129, 279

[56] References Cited

U.S. PATENT DOCUMENTS

| 4,602,218 | 7/1986 | Vilmur et al. ................ 455/126 |
|---|---|---|
| 4,737,733 | 4/1988 | La Prade . |
| 5,126,688 | 6/1992 | Nakanishi et al. .............. 455/126 |
| 5,144,258 | 9/1992 | Nakanishi et al. .............. 455/126 |
| 5,383,223 | 1/1995 | Inokuchi ....................... 330/279 |
| 5,404,586 | 4/1995 | Ishiguro ....................... 455/127 |

FOREIGN PATENT DOCUMENTS

| 3940295 | 6/1991 | Germany . |
|---|---|---|
| 55120232 | 9/1980 | Japan . |

Primary Examiner—Reinhard J. Eisenzopf
Assistant Examiner—Marsha D. Banks-Harold
Attorney, Agent, or Firm—Jack D. Slobod

[57] ABSTRACT

The invention relates to a radio transceiver having a high-frequency output stage and a control circuit for controlling the transmitter power, in which the control circuit is supplied with an actual voltage in the form of a signal derived from the transmit signal. Especially in handheld radios the environment of the antenna is affected by the position of the unit, so that antenna mismatches constantly occur. This can disturb the proper operation of state-of-the-art power control circuits. To avoid such interference, the invention proposed to supply as an actual value to the control circuit a signal which is tapped prior to the signal being supplied to the high-frequency power amplifier output stage.

5 Claims, 1 Drawing Sheet

5,832,374

RADIO TRANSCEIVER INCLUDING TRANSMITTER POWER CONTROL CIRCUIT

This is a continuation of application Ser. No. 08/340,567, filed Nov. 16, 1994 abn.

The invention relates to a radio transceiver having a high-frequency output stage and a control circuit for controlling the transmitter power, in which the control circuit is supplied with an actual voltage value in the form of a signal derived from the transmit signal.

Radio transceivers comprising an arrangement for controlling the transmitter power are always necessary if the power radiated from the radio transceiver is to be adhered to very accurately. This is the case, for example, in modem cellular mobile radio systems in which a central base station defines a specific transmitter power for the mobile stations which depends on the power with which the individual mobile stations can be received. In this manner there may be ensured that the individual signals transmitted by the mobile stations reach the base station substantially with the same signal strength irrespective of the distance between mobile station and base station. In this manner mutual interference as a result of excessively strong signals can be avoided, so that the capacity of the cellular mobile radio network is optimized.

For example, DE 39 40 295 A1 has disclosed a high-frequency transmitter having a controlled output power, in which part of the output power of a HF power amplifier is extracted by a directional coupler located at the output of the HF amplifier. The extracted HF power is rectified by a HF rectifier circuit, inverted in an inverting amplifier and applied to a differential amplifier as an actual value. A set value generator predefines an electric voltage for the differential amplifier in dependence on the desired output power. The voltage difference between set voltage and actual voltage is used by the differential amplifier to produce a control voltage applied to a HF driver amplifier through a control input. The output of the HF driver amplifier is connected to the input of the HF output stage, so that the control loop is closed in this manner.

Due to the fact that the actual voltage is extracted from the output of the output amplifier, any non-linearities of the HF output stage can be compensated for. As a result of the ever-increasing miniaturisation and integration of elements, the trend in mobile radios goes to handhelds which can easily be held in one hand by the users. The consequent mobility of the users, however, has surprisingly led to the fact that increased interference occurred despite transmitter power control.

Because the handhelds have little weight and are small-sized, the users hold them in constantly varying positions. Since the antenna is mounted on the handheld, the environment of the antenna is inevitably continuously changed, so that mismatches of the antenna constantly occur. Due to these mismatches it can occur that the voltage in the measuring sensor connected to the directional coupler output drops. To compensate for the apparent power drop of the high-frequency output stage, the control circuit increases the power amplifier gain and thus saturates the high-frequency output stage. The saturation of the control path and high-frequency output stage respectively, so strongly degrades the output spectrum of a TDMA (Time-Division Multiple Access) transmitter during ascending or descending edges of the signal bursts that adjacent channel interference occurs caused by spurious radiation.

It is an object of the invention to avoid disturbances of the output spectrum in radio transceivers of the type defined in the opening paragraph, especially in handhelds.

A further aspect of the invention is to realize volume reduction in handhelds and increase the operating time of the battery by reducing the power consumption.

This object is achieved in that the control circuit is supplied with an actual value in the form of a HF signal extracted from the transmit signal prior to its being supplied as an input to the HF power amplifier output stage.

With the novel concept of the circuit, the power control is independent of the antenna matching to the transmitter output stage. In this manner there is ensured that the disturbance spectrum always continues to be within the permissible range. An isolating amplifier which may be necessary for extracting power needs to have much less room than the directional coupler customary thus far. In addition, there is no insertion loss of the directional coupler (about 1 to 3 dB), so that there is no power increase either of the output stage necessary for equalizing the insertion loss and thus the power consumption in the transmitting mode is reduced. Therefore, a circuit according to the invention is especially suitable for handhelds.

The invention will now be further described with reference to an embodiment shown in the drawings, in which.

Figure 1:
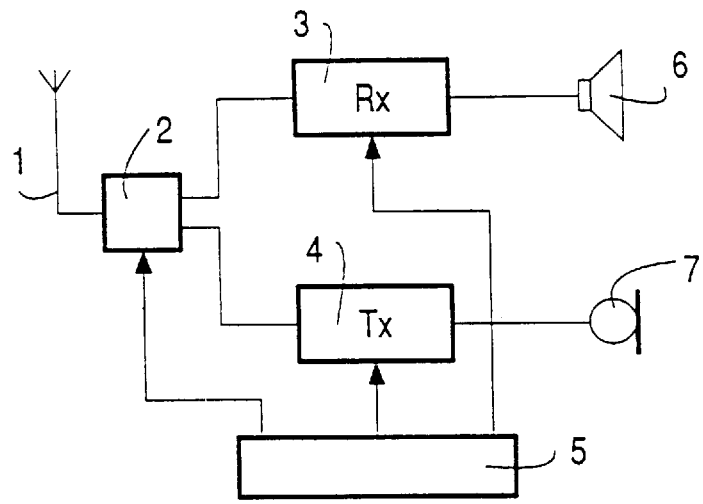
FIG. 1 shows a general block diagram of a radio transceiver.

FIG. 1 shows a mobile radio transceiver for the time-division multiple access mode (TDMA) in which transmit and receive signals, time compressed to data packets, are transmitted and received at different instants. A common antenna 1 which is alternately connected to a receiving section 3 or a transmitting section 4 of the radio transceiver via an antenna switch 2 is sufficient for this purpose. A control circuit 5 is provided to control the antenna switch 2, the receiving section 3 and the transmitting section 4. The received signal 3 is processed in a normal way, so that it is reproduced via a loudspeaker. Spoken signals are recorded by a microphone 7 and also processed by transmitting section 4 in known manner. The transmitting section specifically comprises a low-frequency portion to amplify the microphone signal, a coding portion to reduce data of the microphone signal, one or more oscillators to generate a carrier signal, a modulator by which the time compressed speech signal is superimposed on the carrier signal and a transmitter output stage which is used for amplifying the power and controlling the power of the signal to be transmitted.

Figure 2:
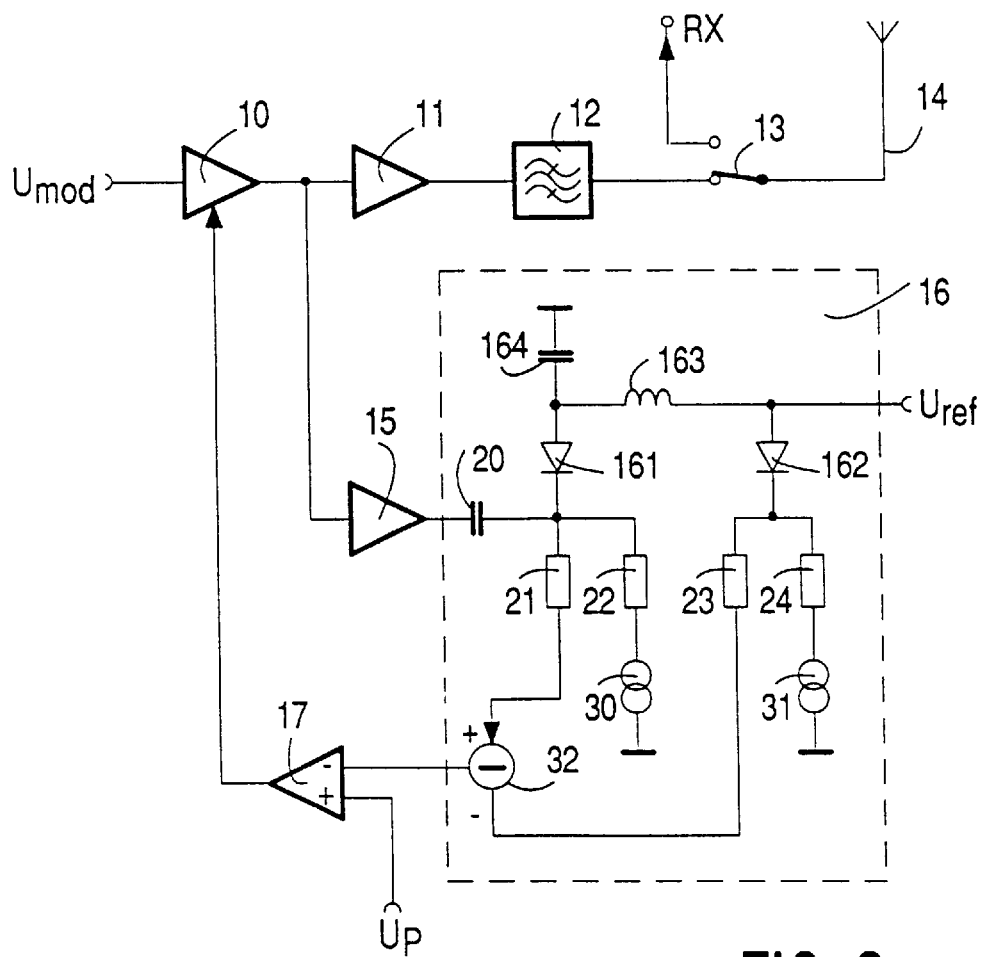
FIG. 2 shows a section of the transmitter output stage of a radio transceiver.

In FIG. 2 is shown as a preferred embodiment only the transmitter output stage included in the invention. A modulation signal $U_{mod}$ is applied to a controllable HF driver amplifier 10. The controllable HF driver amplifier 10 has a control input. The output amplitude of the controllable HF amplifier is set in dependence on a control voltage available on its control input.

The output of the controllable HF driver amplifier 10 is connected to a HF power output stage 11 having a substantially constant power gain. The output signal of the HF output stage 11 is fed to an antenna 14 via a HF output filter 12 and a switch contact of an antenna switch 13. The antenna switch 13 is shown in FIG. 2 in the switch position of the transmit mode. In the receive mode the antenna switch 13 has the other switch position, so that the antenna input signal is fed to the receiving section RX.

To control the power level, the input signal of the HF power output stage 11 is further extracted unattenuated via a distribution amplifier. This distribution amplifier will be referenced sensor driver amplifier 15 in the following due to its function of deriving a value proportional to the HF power and simultaneously providing sufficient power for the subsequent HF rectifier arrangement 16. The HF signal amplified by the sensor driver amplifier 15 is applied by the coupling capacitor 20 to the cathode of a HF rectifier diode 161. Between the anode of the HF rectifier diode 161 and ground there is a second capacitor 164. The rectified HF signal is applied to a summing amplifier 32 via a first coupling resistor 21. The rectifier diode 161 is connected to a reference voltage $U_{ref}$ via a HF inductor 163 to produce a DC bias voltage. The DC current flows through the rectifier diode 161 and a second resistor 22 to a first current source 30. To compensate for the diode bias voltage, except for the application of the HF signal, a substantially identical diode branch is arranged whose output voltage is subtracted in the summing amplifier 32 from the output voltage of the rectifier diode 161, so that only the rectified HF voltage is left as the output signal of the summing amplifier 32. Preferably, a diode substantially the same as the HF rectifier diode 161 is selected as the compensation diode 162. The compensation diode 162 is connected with its anode to the reference voltage $U_{ref}$ too. The cathode of the compensation diode 162 is connected to the inverting input of the summing amplifier via a third resistor 23. Furthermore, the cathode of the compensation diode 162 is connected to a second constant current source 31 via a fourth resistor 24. For good DC voltage compensation the resistances of the first resistor 21 and third resistor 23, and of the second resistor 22 and the fourth resistor 24, respectively should be selected to be substantially the same. Furthermore, the two current sources 30 and 31 are to be selected such that they have substantially the same constant currents.

The output of the summing amplifier 32 is connected to the inverting input of a control amplifier 17. The non-inverting input of the control amplifier 17 is supplied with a control voltage $U_p$. The difference between the two voltages provides the control voltage necessary for driving the controllable HF preamplifier 10. In this manner the control loop is closed. Further control loop elements known to those skilled in the art such as, for example, filters and offset compensation circuits are not shown in FIG. 2 for clarity.

By means of the control voltage $U_p$ the desired output power is predefined. Especially when the ascending and descending edges of the TDMA signal are produced, the control circuit 5 can predefine the signal variation of the edges. Because the output of the HF power output stage 11 is largely decoupled from the output signal of the sensor driver amplifier 15, there is ensured that mismatches of the antenna do not have any effect on the control voltage $U_p$ of the driver amplifier 10. This provides that the spectrum of the TDMA signal continues to be of the same quality irrespective of the adaptation of the transmitter output stage.

Since the directional coupler is omitted, the circuit according to the invention can be fully integrated in a monolithic microwave integrated circuit (MMIC), for example, on a gallium arsenide base. In this manner it is possible to save the 4 to 5 cm longitudinal extension of the directional coupler structure otherwise customary in the state of the art completely.

An important aspect to achieve good control accuracy over variations in, for example, temperature power level, supply voltage and manufacturing tolerances is that any variation in gain for the power output stage should be closely matched by a corresponding variation for the distribution amplifier. The output powers of the main and distribution amplifiers will then be well correlated and control of the distribution amplifier output will result in accurate control of the main output.

Close matching of the main and distribution amplifiers can be achieved by implementing both together in a single integrated circuit (either silicon or gallium arsenide), exploiting the excellent matching of components provided by this technology.

The foregoing merely illustrates the principles of the invention. It will thus be appreciated that those skilled in the art will be able to devise various arrangements which, although not explicitly described or shown herein, embody the principles of the invention and are thus within its spirit and scope.

We claim:

1. A radio transceiver, comprising:

a gain controlled high-frequency driver amplifier stage having a signal output and having a control input for controlling the gain of the driver amplifier stage;

a high-frequency power amplifier output stage having substantially constant gain, an input coupled to the signal output of the driver amplifier stage, and an output coupled to an antenna by coupling means which does not include any means for extracting, for the purpose of feedback control, a portion of power flowing in the coupling means;

a high-frequency rectifier stage connected to the signal output of the driver amplifier stage for producing a control signal representing the amplitude of an HF signal outputted by the driver amplifier stage;

a reference voltage source for producing a reference voltage representing a desired output power of the output stage; and a differential control amplifier stage responsive to the control signal produced by the rectifier stage and the reference voltage produced by the reference voltage source for producing a difference control voltage, the difference control voltage being supplied to the control input of the driver amplifier stage;

wherein a constant relationship is maintained between at least one characteristic of the rectifier stage and one characteristic of the output stage;

whereby the gain of the driver amplifier stage is controlled by the difference control voltage, thereby controlling the output power of the output stage.

2. The radio transceiver as claimed in claim 1, characterized in that the radio transceiver is a mobile radio transceiver for time division multiple access (TDMA) operation.

3. The radio transceiver as claimed in claim 1, wherein the characteristic is the gain of the respective output stage and the rectifier stage.

4. A radio transceiver, comprising:

a gain controlled high-frequency driver amplifier stage having a signal output and having a control input for controlling the gain of the driver amplifier stage;

a high-frequency power amplifier output stage having substantially constant gain, an input coupled to the signal output of the driver amplifier stage, and an output coupled to an antenna by coupling means which does not include any means for extracting, for the purpose of feedback control, a portion of power flowing in the coupling means;

a high-frequency rectifier stage connected to the signal output of the driver amplifier stage for producing a control signal representing the amplitude of an HF signal outputted by the driver amplifier stage;

a reference voltage source for producing a reference voltage representing a desired output power of the output stage;

a differential control amplifier stage responsive to the control signal produced by the rectifier stage and the reference voltage produced by the reference voltage source for producing a difference control voltage, the difference control voltage being supplied to the control input of the driver amplifier stage; wherein at least the output stage and the rectifier stage are implemented in a single integrated circuit.

5. A radio transceiver, comprising:

a gain controlled high-frequency driver amplifier stage having a signal output and having a control input for controlling the gain of the driver amplifier stage;

a high-frequency power amplifier output stage having substantially constant gain, an input coupled to the signal output of the driver amplifier stage, and an output coupled to an antenna by coupling means which does not include any means for extracting, for the purpose of feedback control, a portion of power flowing in the coupling means;

a high-frequency rectifier stage connected to the signal output of the driver amplifier stage for producing a control signal representing the amplitude of an HF signal outputted by the driver amplifier stage;

a reference voltage source for producing a reference voltage representing a desired output power of the output stage; and a differential control amplifier stage responsive to the control signal produced by the rectifier stage and the reference voltage produced by the reference voltage source for producing a difference control voltage, the difference control voltage being supplied to the control input of the driver amplifier stage;

wherein the gain of the rectifier stage remains closely matched to the gain of the output stage;

whereby the gain of the driver amplifier stage is controlled by the difference control voltage, thereby controlling the output power of the output stage.

* * * * *